(12) United States Patent
Weickenmeier

(10) Patent No.: US 6,777,166 B2
(45) Date of Patent: Aug. 17, 2004

(54) PARTICLE-OPTICAL LENS ARRANGEMENT AND METHOD EMPLOYING SUCH A LENS ARRANGEMENT

(75) Inventor: Andreas Weickenmeier, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 30 days.

(21) Appl. No.: 10/087,601

(22) Filed: Mar. 1, 2002

(65) Prior Publication Data

US 2002/0126366 A1 Sep. 12, 2002

(30) Foreign Application Priority Data

Mar. 1, 2001 (DE) .......................... 101 09 965

(51) Int. Cl.⁷ .............................. G03C 5/00; G03F 9/00; G21K 5/10
(52) U.S. Cl. .......................... 430/296; 430/322; 430/5; 430/22; 250/492.22
(58) Field of Search ................................ 359/283, 298, 359/558, 619, 622, 637; 430/5, 22, 30, 296, 322; 250/292.22–23, 492.1, 492.22; 702/126, 40; 204/157.48, 456

(56) References Cited

U.S. PATENT DOCUMENTS

| | | |
|---|---|---|
| 4,376,249 A | 3/1983 | Pfeiffer et al. ....... 250/396 ML |
| 4,525,629 A | 6/1985 | Morita et al. ......... 250/396 ML |
| 4,544,846 A | 10/1985 | Langner et al. ...... 250/396 ML |
| 4,882,486 A | 11/1989 | Kruit ........................... 250/305 |
| 4,929,838 A | 5/1990 | Yasuda et al. ............ 250/492.2 |
| 4,945,246 A | 7/1990 | Davis et al. .............. 250/492.2 |
| 4,977,324 A | 12/1990 | Kruit et al. .......... 250/396 ML |
| 5,258,246 A | 11/1993 | Berger et al. ................... 430/4 |
| 5,285,074 A | 2/1994 | Haire et al. ............. 250/396 R |
| 5,382,498 A | 1/1995 | Berger ........................ 430/296 |
| 5,389,858 A | 2/1995 | Langner et al. ............. 315/370 |
| 5,466,904 A | 11/1995 | Pfeiffer et al. ......... 219/121.25 |
| 5,481,164 A | 1/1996 | Langner et al. ............. 315/370 |
| 5,523,580 A | 6/1996 | Davis ....................... 250/505.1 |

(List continued on next page.)

FOREIGN PATENT DOCUMENTS

| | | | |
|---|---|---|---|
| DE | 39 29 774 A1 | 3/1991 | ............ H01J/31/28 |
| DE | 197 38 070 A1 | 3/1999 | |
| DE | 198 55 629 A1 | 6/2000 | |
| EP | 0 969 326 A2 | 1/2000 | |

OTHER PUBLICATIONS

Patent Abstract of Japan, Publication No. 11025896, Publication Date Jan. 29, 1999, 1 page.

(List continued on next page.)

*Primary Examiner*—Georgia Epps
*Assistant Examiner*—Jack Dinh
(74) *Attorney, Agent, or Firm*—Osha Novak & May L.L.P.

(57) ABSTRACT

The present invention discloses a lens arrangement for the particle-optical imaging of an object to be imaged and positionable in an object plane into an image area. In one embodiment, the lens arrangement includes a first focusing lens device for providing a field having a focusing effect on the imaging particles for imaging the object from the object area into an intermediate image area, a second focusing lens device for providing a further field having a focusing effect on the imaging particles for imaging the object, which has been imaged into the intermediate image area, into the image area, and a deflection lens device for providing a field having a deflecting effect on the imaging particles in a region of the intermediate image area. The deflection lens device is disposed in the intermediate image area primarily to compensate for aberrations, such as image field curvature.

17 Claims, 7 Drawing Sheets

U.S. PATENT DOCUMENTS

| | | | |
|---|---|---|---|
| 5,545,902 A | 8/1996 | Pfeiffer et al. | 250/492.2 |
| 5,633,507 A | 5/1997 | Pfeiffer et al. | 250/492.23 |
| 5,635,719 A | 6/1997 | Petric | 250/396 ML |
| 5,674,413 A | 10/1997 | Pfeiffer et al. | 219/121.25 |
| 5,708,274 A | 1/1998 | Langner et al. | 250/396 ML |
| 5,747,814 A | 5/1998 | Gordon et al. | 250/398 |
| 5,747,819 A | 5/1998 | Nakasuji et al. | 250/492.23 |
| 5,757,010 A | 5/1998 | Langner | 250/396 ML |
| 5,770,863 A | 6/1998 | Nakasuji | 250/492.2 |
| 5,793,048 A | 8/1998 | Petric et al. | 250/396 ML |
| 5,825,043 A | 10/1998 | Suwa | 250/548 |
| 5,849,437 A * | 12/1998 | Yamazaki et al. | 430/5 |
| 5,850,083 A | 12/1998 | Koikari et al. | 250/396 R |
| 5,952,667 A | 9/1999 | Shimizu | 250/492.2 |
| 5,973,333 A | 10/1999 | Nakasuji et al. | 250/492.23 |
| 5,977,550 A | 11/1999 | Nakasuji | 250/492.2 |
| 5,994,708 A | 11/1999 | Nakasuji | 250/492.23 |
| 6,005,250 A | 12/1999 | Stickel et al. | 250/396 R |
| 6,023,067 A | 2/2000 | Stickel et al. | 250/396 R |
| 6,037,601 A | 3/2000 | Okunuki | 250/492.23 |
| 6,051,839 A | 4/2000 | Crewe | 250/396 ML |
| 6,060,711 A | 5/2000 | Shimizu | 250/358 |
| 6,064,071 A | 5/2000 | Nakasuji | 250/492.23 |
| 6,066,853 A | 5/2000 | Nakasuji | 250/398 |
| 6,066,855 A | 5/2000 | Simizu | 250/492.22 |
| 6,069,684 A | 5/2000 | Golladay et al. | 355/53 |
| 6,078,054 A | 6/2000 | Nakasuji | 250/396 R |
| 6,078,382 A | 6/2000 | Nakasuji | 355/55 |
| 6,090,527 A * | 7/2000 | Yamazaki et al. | 430/296 |
| 6,124,596 A | 9/2000 | Nakasuji et al. | 250/396 ML |
| 6,280,906 B1 * | 8/2001 | Braat et al. | 430/296 |
| 6,355,384 B1 * | 3/2002 | Dauksher et al. | 430/5 |

OTHER PUBLICATIONS

German Search Report dated Jul. 19, 2001, 1 page.
European Patent Office Search Report dated Jun. 6, 2002, 1 page.

* cited by examiner

PARTICLE-OPTICAL LENS ARRANGEMENT AND METHOD EMPLOYING SUCH A LENS ARRANGEMENT

FIELD OF THE INVENTION

The invention relates to a particle-optical lens arrangement, in particular for the particle-optical imaging of an object, to be imaged and positionable in an object area, into an image area, as well as a method employing such a lens arrangement, in particular, a method for device manufacture comprising a photolithographic step. In particular, the lens arrangement is provided for use in an electron beam projection lithographic system as well as for use in a method for device manufacture by means of electron beam projection lithography.

BACKGROUND OF THE INVENTION

The SCALPEL method (Scattering with Angular Limitation in Projection Electron-beam Lithography) is known as a method which employs a beam of electrons for imaging and exposing a radiation sensitive layer. This process is described in the white book "SCALPEL: A Projection Electron-Beam Approach to Sub-Optical Lithography", Technology Review, December 1999, by J. A. Liddle, Lloyd R. Harriott, A. E. Novembre and W. K. Waskiewicz, Bell Laboratories, Lucent Technologies, 600 Mountain Avenue, Murray Hill, N.J. 07974, USA. The entire disclosure of said document is incorporated herein by reference. Furthermore, U.S. Pat. Nos. 5,079,112, 5,130,213, 5,260,151, 5,376,505, 5,258,246, 5,316,879 as well as European patent applications nos. 0,953,876 A2 and 0,969,326 A2 relate to the SCALPEL process. The entire disclosures of the above-mentioned patent documents are likewise incorporated herein by reference.

A conventional imaging lens arrangement with two focusing lenses which can be employed for this purpose is described herein below with reference to FIG. 1.

FIG. 1 schematically shows a mask support 1 carrying an object, namely structures 3 which are provided in the form of a mask and are to be imaged, such that said structures are disposed in a focal plane of a focusing magnetic lens 5, i.e., they are spaced apart from the magnetic lens by a distance corresponding to the focal length of the magnetic lens.

The lens 5 images the object plane with the pattern 3 to be imaged to infinity, and a further magnetic lens 7 is provided for imaging the pattern imaged by the lens 5 onto a substrate surface 9 which is spaced apart from the lens 7 by a distance corresponding to the focal length thereof. Between the two lenses 5 and 7, there is provided an aperture stop 11 which is spaced apart from the lens 5 by a distance corresponding to the focal length thereof and from the lens 7 by a distance corresponding to the focal length of the lens 7. Particle beams 12, 13 traversing the mask outside of the structures 3 to be imaged traverse the mask substantially straightly such that they pass through a so-called "crossover point" disposed in the center of the aperture stop 11, so that these beams are imaged onto the substrate surface 9. The structures 3 to be imaged are defined by a material on the mask support 1, which material scatters the electrons comparatively strongly, so that beams impinging on such a stronger scattering structure 3 are deflected from their original direction, as it is shown in FIG. 1 for a beam 14. Accordingly, this beam cannot be deflected by the lens 5 to the crossover point in the aperture stop 11, so that it is absorbed by the aperture stop 11 and thus not imaged onto the substrate 9 either.

In order for the mask 3 to be imaged onto the substrate 9, it is not necessary to particle-optically illuminate the entire mask at once. Rather, it is also possible to illuminate at any time merely a subfield of the mask and to move said subfield over the mask area in scanning fashion. A subfield is outlined in FIG. 1 by central and peripheral beams 12, said subfield being positioned centrally on an optical axis 15 of the lenses 5 and 7. A subfield which is offset in the mask plane in respect of the optical axis 15 by a distance M is outlined by central and peripheral beams designated by reference numeral 13.

SUMMARY OF THE INVENTION

It has been found that, in the above-described lens arrangement, imaging characteristics satisfying higher demands are not achievable, in particular for subfields which are deflected from the optical axis.

It is an object of the present invention to propose a particle-optical imaging lens arrangement which enables a reduction of aberrations.

In particular, it is an object of the invention to propose a lens arrangement which enables the reduction of aberrations for particle beams which extend outside of an optical axis of components of the lens arrangement.

Moreover, it is an object of the invention to propose a method for manufacturing miniaturized devices which enables the device to be manufactured with increased precision.

According to a first aspect of the invention, a lens arrangement is provided for the particle-optical imaging of an object, to be imaged and positionable in an object area, into an image area, the lens arrangement comprising a first focusing lens device and a second focusing lens device as well as a deflection lens device. Here, the object area and the image area may at first be of any shape given by the image. However, in practice, an approximation of at least one of the areas to a planar shape is strived at in order to enable, first, a simple configuration of the object or/and the image area and, second, to reduce aberrations which result, among others, from the fact that the object is not exactly positioned in the intended object area or a substrate to be exposed is not exactly positioned in the intended object area.

The first focusing lens device provides a field which has a focusing effect on the imaging particles, so that at least a subfield of the object area is imaged into a subfield of an intermediate image area of the lens arrangement. The second focusing lens device, too, provides a field having a focusing effect, namely for imaging at least the subfield of the intermediate image area into a subfield of the image area.

In order to reduce aberrations of the first and/or the second focusing lens device, the lens arrangement comprises a deflection lens device for providing a field having a deflecting effect on the imaging particles in the region of the intermediate image area. The field of the deflection lens device having a deflecting effect causes the intermediate image to tilt before it is imaged by the second focusing lens device into the image area. Accordingly, aberrations which result into a tilt of the image area relative to a nominal image area can be compensated for. In particular, these aberrations are such which are referred to as image field curvature.

A field having a focusing effect is to be understood in this connection as a field which substantially does not deflect a suitably selected central beam and which deflects decentral beams extending with increasing distance from the central beam and parallel thereto towards the central beam, the angle at which the decentral beams are deflected towards the central beam also increasing with increasing distance of the diffracted beam from the central beam. This focusing effect need not be produced, at a given point in time, in the entire effective range of the fields of the first and the second focusing lens devices, respectively. Rather, it suffices if a partial section of the fields of the focusing lens device has such a focusing effect on the particles traversing said partial section. The effect which the focusing lens device has on the imaging particles is thus comparable to that which a convex lens has in light optics.

Preferably, the first or/and the second focusing lens device provides a field which comprises a magnetic or/and electric field which is substantially axially symmetric in respect of such a central beam of a bundle of beams. As an alternative or in addition thereto, the first or/and the second focusing lens device may comprise two or three axially spaced apart field arrangements in order to achieve the focusing effect, wherein the two field arrangements may comprise dipole or/and quadrupole field arrangements or combinations thereof and, together, produce the focusing effect. Generally, by positioning several field arrangements successively in beam direction, which field arrangements as such do not produce non-rotationally symmetric fields, a lens effect is achievable which corresponds to that of a round lens.

The deflecting field of the deflection lens device deflects particles traversing the same substantially into the same direction. Therefore, the field of the deflection lens device is in particular not axially symmetric. Preferably, the field of the deflection lens device is mirror-symmetric to a plane into which a central beam of a bundle of beams of the imaging particles extends. In particular, the field of the deflection lens device is a magnetic or/and electric dipole field which is oriented transversely to a direction of propagation of the imaging particles. The field of the deflection lens device thus has an effect on the imaging particles which is comparable to that of a wedge lens in light optics.

The field of the deflection lens device is effective in a certain region around the intermediate image area extending out of the intermediate image area, i.e., the area into which the object area is imaged by the first focusing lens device.

It is the characteristic of the intermediate image area that partial beams which emerge from the object area at one location, however, at different angles, traverse the intermediate image area substantially at a common location likewise at different angles, with beams emerging from different locations of the object area likewise traversing the intermediate image area at different locations.

The intermediate image area of the first focusing lens device thus differs from the diffraction area of the first focusing lens device which is positioned between the intermediate image plane and the first focusing lens device as such. Because it is the characteristic of the diffraction area that beams which emerge from the object area at different locations, but at the same angle, traverse the diffraction area at the same locations, but at different angles. Here, beams emerging from the object area at different angles also traverse the diffraction area at different locations.

Furthermore, a diffraction area allocated to the second focusing lens device is disposed between the intermediate image plane and the second focusing lens device. In this second diffraction area, beams which impinge on the image area at the same angle meet at the same location, but at different angles. The diffraction area of a focusing lens is also commonly referred to as Fourier area.

Preferably, an aperture filter is provided in the diffraction area of the first or/and the second focusing lens device for absorbing beams which traverse the object area at an angle exceeding a predetermined angle.

Preferably, the lens arrangement is provided for imaging a subfield of the object area into the image area, wherein the location of the subfield is variably adjustable likewise to a subfield of the object area. In particular, a distance of the subfield from a predetermined axis is adjustable, said axis comprising, for example, a central optical axis of the first or/and the second focusing lens device. It has been found, in this respect, that the deflection lens device is particularly suited to compensate for effects produced by the image field curvature caused by aberrations of the first or/and second focusing lens device. To this end, a field strength of the deflection lens device is preferably adjusted such that it changes proportional to the distance of the subfield from the predetermined axis. The deflection lens device causes the subfield imaged into the image area to be tilted and can be adjusted such that the image area in the region of the currently imaged subfield is of approximately planar shape and thus all subfields of a planar object area can be imaged successively in time substantially into a planar image area.

In this respect, it is in particular also provided for that the strength of the fields of the first or/and the second focusing lens device is changed quadratically dependent on the distance of the subfield from the predetermined axis. As a result, a malfocus caused by an image field curvature can be compensated for such that the images of a planar object area are substantially sharply imaged into a planar image area as well.

According to a second aspect, the invention also provides for a method for device manufacture, such devices being preferably highly miniaturized devices, such as micromechanical structures or integrated circuits. As far as integrated circuits are concerned, a mask includes a circuit pattern which corresponds to a single layer of the circuit to be formed on a suitable substrate, for example, a silicon wafer. In order to image the pattern onto a target area, also referred to as die, of the substrate, the latter is first covered with a radiation sensitive layer, also referred to as resist. Subsequently, the radiation sensitive layer is exposed or irradiated in that the pattern of the mask is imaged by means of charged particles, for example, electrons or ions, onto the radiation sensitive layer. The radiation sensitive layer is then developed and either the irradiated or exposed or the non-irradiated or unexposed regions of the irradiated layer are removed. The remaining structure of the radiation sensitive layer is then used as a mask, for example, in an etching step, an ion implantation step, a material deposition step or the like.

According to the invention, a pattern defined by a mask is imaged onto a particle-sensitive substrate by means of the above-described lens arrangement in a photolithographic step of the method.

Exemplary embodiments of the invention will be described below with reference to the accompanying drawings, wherein

DETAILED DESCRIPTION

Figure 1:
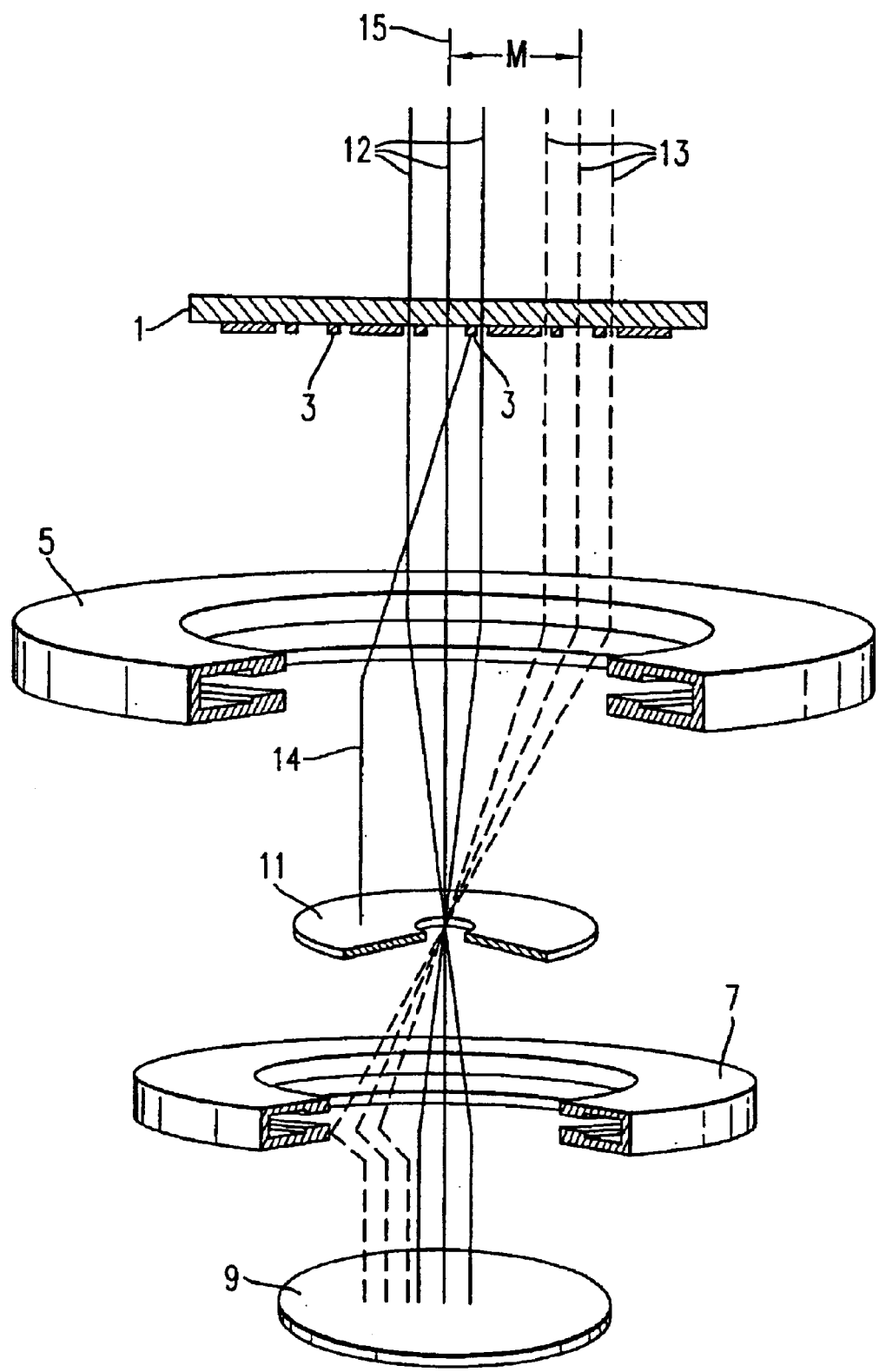
FIG. 1 depicts a lens arrangement according to the prior art.
Figure 2:
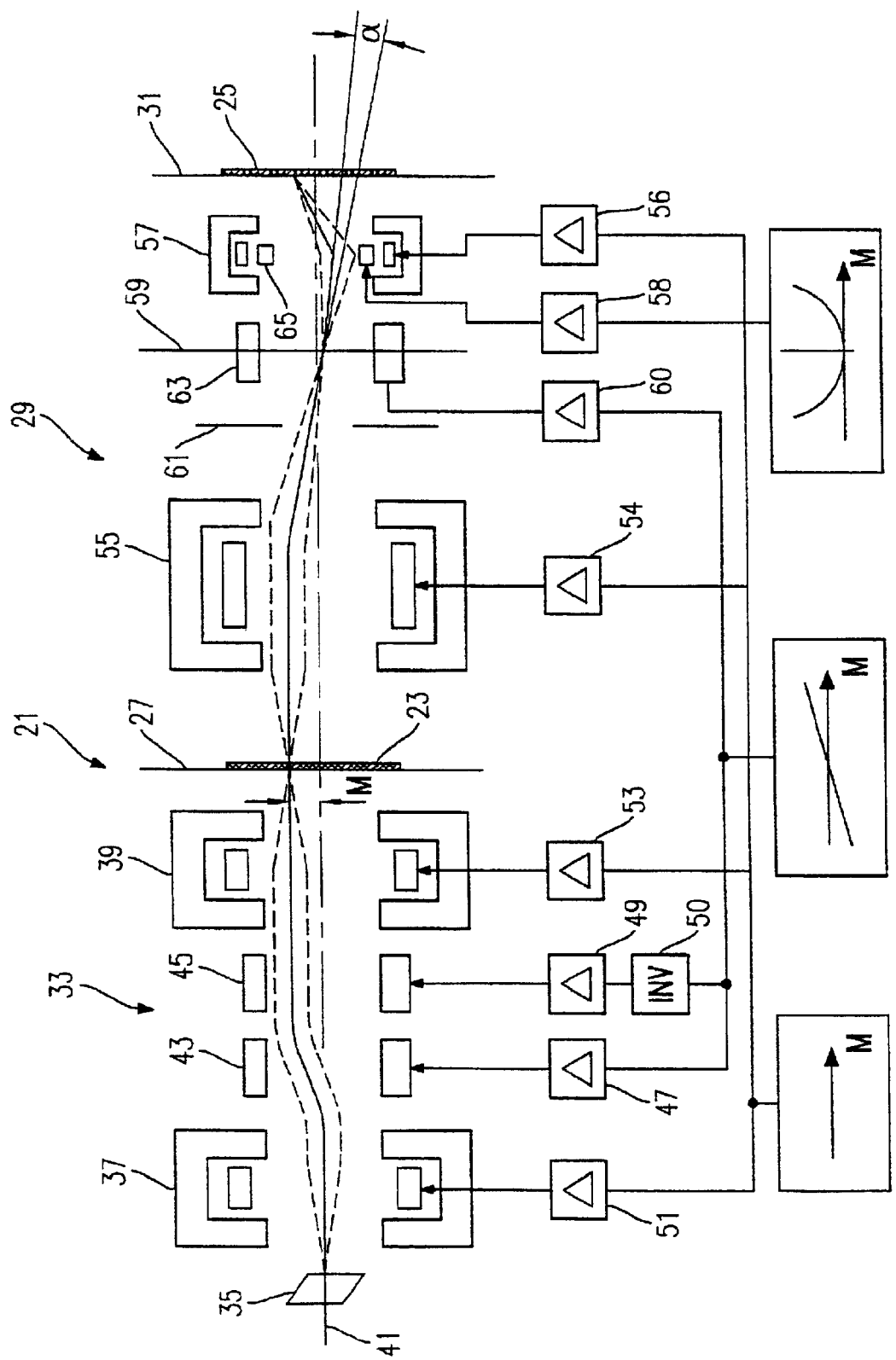
FIG. 2 schematically depicts a structure of a lens arrangement according to the invention as well as schematically a beam path extending therethrough.
Figure 3A:
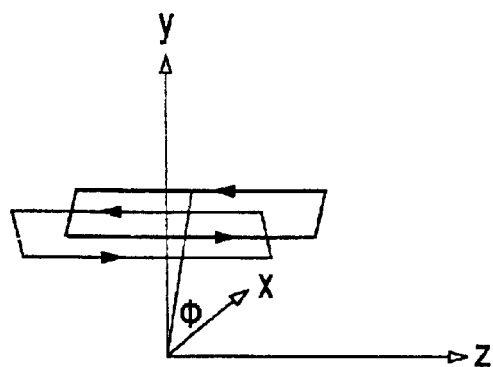
FIGS. 3A–3C depict different types of coils of a deflection lens device shown in FIG. 2, FIGS. 4A–4C depict different arrangements of current conducting windings of the deflection lens device shown in FIG. 2 around the circumference of a ferrite ring.
Figure 3B:
Figure 3B:
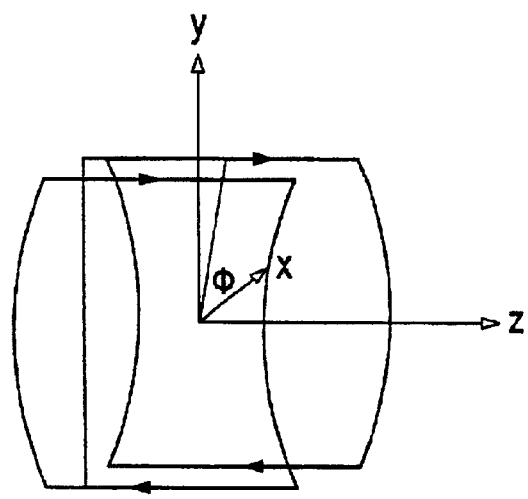
Figure 3C:
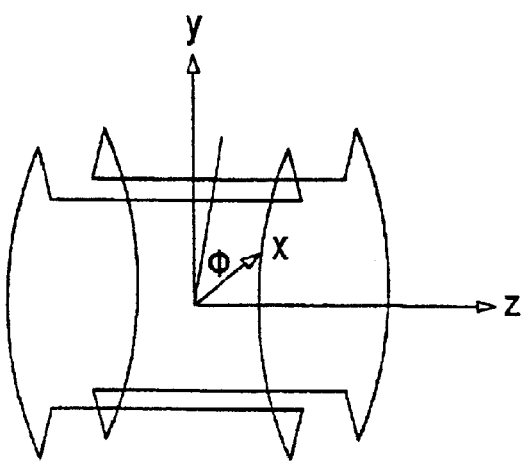

An electron projection lithographic system 21 shown in FIG. 2 is used to image a structure defined on a mask 23 onto a semiconductor wafer 25 provided with a radiation sensitive layer. To this end, the effective layer of the mask 23 is positioned in an object plane 27 of a lens arrangement 29, the radiation sensitive layer of the wafer 25 being disposed in the image plane 31 of said lens arrangement.

In addition to the lens arrangement 29 for imaging the mask 23 onto the wafer 25, the projection lithographic system 21 comprises an illumination arrangement 33 for illuminating the mask 23. The illumination arrangement 33 comprises an electron source, not shown in FIG. 2, for illuminating a beam shaping aperture filter 35 defining an illuminated subfield of the mask 23. To this end, the beam-shaping aperture 35 illuminated by the electron source, not shown, is imaged by means of two focusing lenses 37 and 39 into the object plane 27 of the lens arrangement 29. The two focusing lenses 37 and 39 are symmetrically disposed in respect of an optical axis 41 of the projection system 21. The illuminated subfield in the object plane 27, said subfield being defined by the beam shaping aperture 35 which is equally disposed centrally on the optical axis 41, can be shifted from the optical axis 41 transverse to the object plane in that two deflection units 43 and 45 are correspondingly driven. To this end, the deflection units 43 and 45 comprise suitable drivers 47 and 49 which are driven with a dependency proportional to the desired deflection M of the subfield from the optical axis, the two drivers 47 and 49, however, being each driven with respectively reversed sign, an inverter 50 being provided for this purpose. The focusing lenses 37 and 39 are driven by drivers 51 and 53 substantially independent of the deflection M.

The imaging of the illuminated subfield from the object plane 27 of the lens arrangement 29 into the image plane 31 of the same is effected substantially by a focusing lens 55 and a further focusing lens 57. The focal lengths of the two focusing lenses 55 and 57 and the distances thereof from the object plane 27 and the image plane 31 are adjusted to each other such that the imaging from the object plane 27 into the image plane 31 is performed reduced in size by a factor of 1:4.

Furthermore, the focal lengths and the distances are adjusted such that the object plane 27 is first imaged into an intermediate image plane 59 by the focusing lens 55, said intermediate image plane being then imaged into the image plane 31.

In order for the corresponding focal lengths of the focusing lenses 55 and 57 to be adjusted, individually adjustable drivers 54 and 56, respectively, are provided which are, however, driven substantially independently from the deflection M.

Furthermore, in a diffraction plane of the focusing lens 55, there is provided an aperture stop 61 for absorbing electrons which have been scattered at a possibly stronger scattering structure of the mask 23 and, for this reason, are not to impinge onto the radiation sensitive layer on the wafer, whereby the desired imaging of the structures of the mask onto the substrate is achieved.

In order to compensate for aberrations between the object plane 27 and the image plane 31, a so-called dynamic focusing coil 65 is provided which is disposed within the focusing lens 57. The dynamic focusing coil 65 serves to compensate for a malfocus and is driven by means of a driver 58 such that its field changes with a substantially quadratic dependency on the deflection of the subfield M. Such a compensation of a malfocus dependent upon the deflection M of the subfield could also be effected with the focusing lenses 55 and 57 alone. However, they comprise pole shoes and are thus relatively inert so that the compensation by the separate dynamic focusing coil 65 can be effected with more precision.

Moreover, in order to compensate for the effect of an image field curvature, when imaging is performed through the focusing lenses 55 and 57, a deflection lens device 63 is provided in the intermediate plane 59, said deflection lens device deflecting beams traversing the same at an adjustable angle α. The deflection lens device 63 is driven by means of a driver 60 such that the deflection angle α changes substantially proportional to the deflection M of the subfield from the optical axis 41.

Possible winding embodiments of the deflection lens device 63 are schematically shown in FIG. 3. FIG. 3a show a configuration of windings as a toroidal coil, FIG. 3b shows a configuration as a saddle coil and FIG. 3c shows a configuration as compound saddle coil. The individual coil windings of the deflection lens device are wound on one or more ferrite rings 71 (see FIG. 4) which are positioned concentrically in respect of the optical axis 41. The distribution of the individual windings in circumferential direction of the ferrite ring 71 is evident from FIG. 4.

Figure 4A:
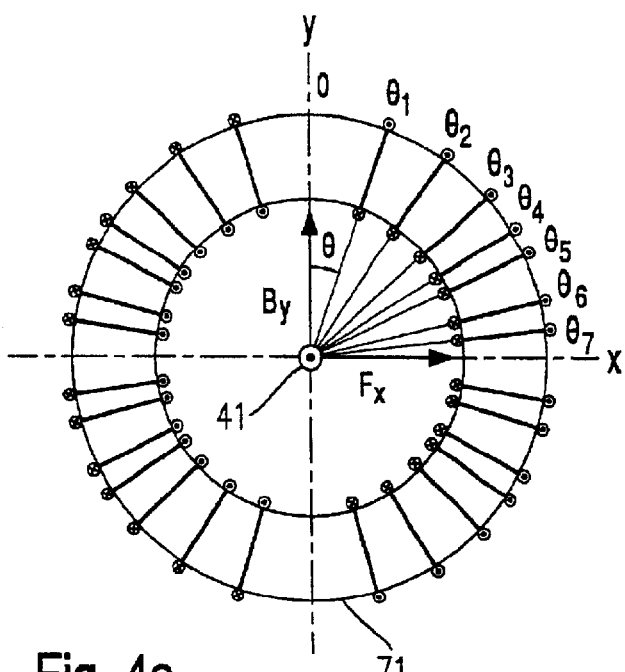
Figure 4B:
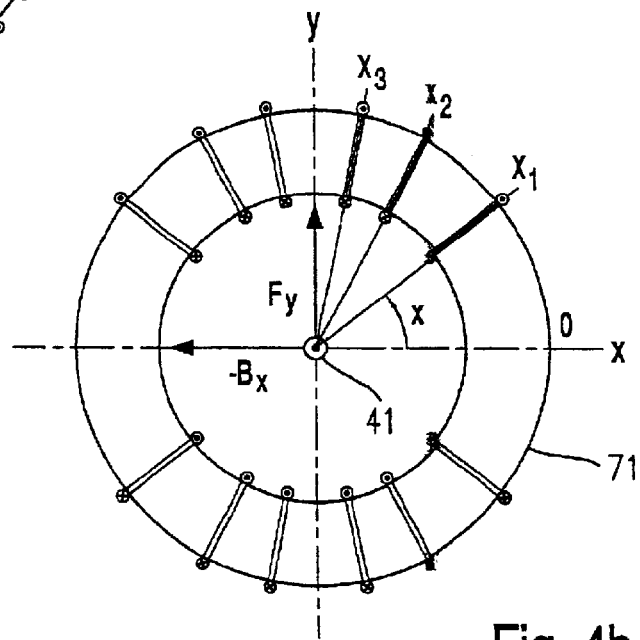
Figure 4C:
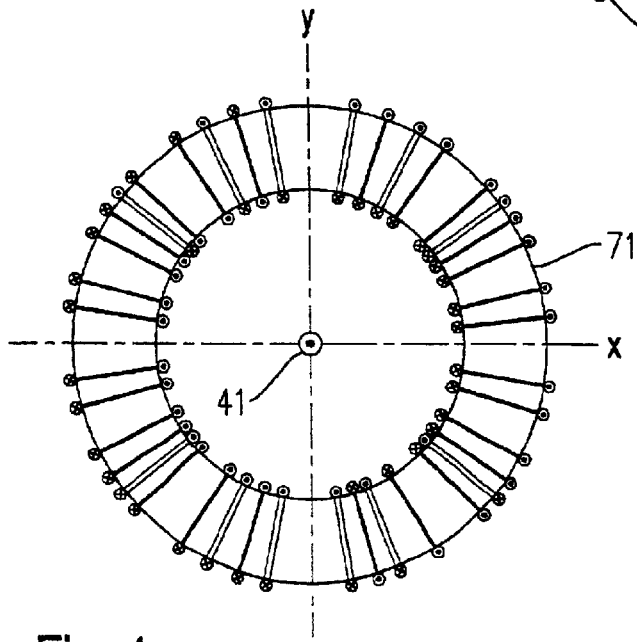

FIG. 4a shows windings which are used to produce a magnetic dipole field $B_y$ directed into a Y-direction. FIG. 4b shows windings which are used to produce a dipole field $B_x$ directed orthogonally thereto. FIG. 4c shows the combination of the windings shown in FIGS. 4a and 4b on the ferrite ring 71.

The effect of the deflection lens 63 disposed in the intermediate image plane 59 is now described with reference to FIGS. 5 and 6. In accordance with their optical analogue, the focusing lenses 55 and 57 are represented as convex lenses, while the deflection lens 59, in accordance with its optical analogue, is symbolized as wedge or prism in FIG. 5.

Figure 5:
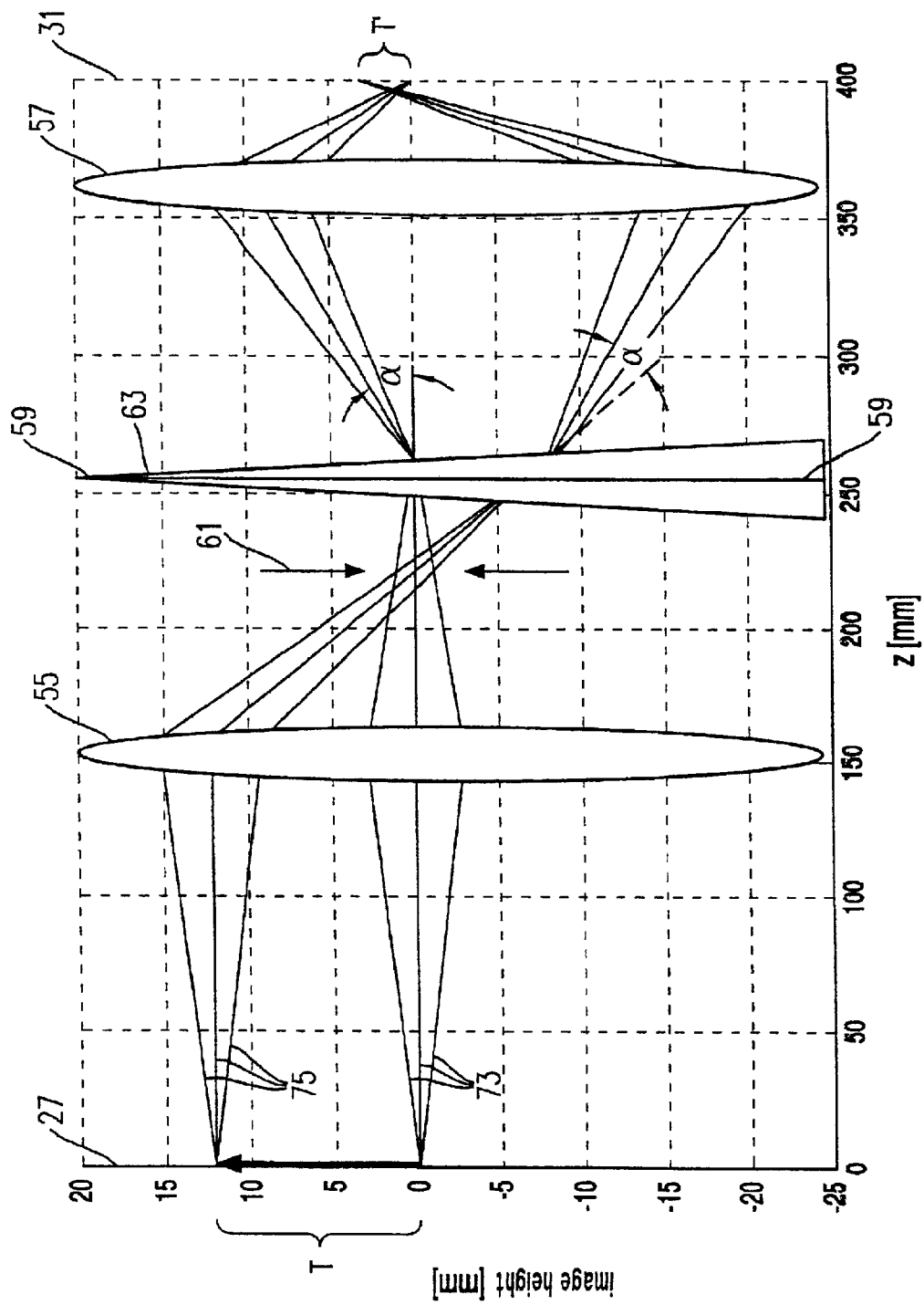
FIG. 5 is a further schematic representation of the beam path through the lens arrangement shown in FIG. 2
Figure 6:
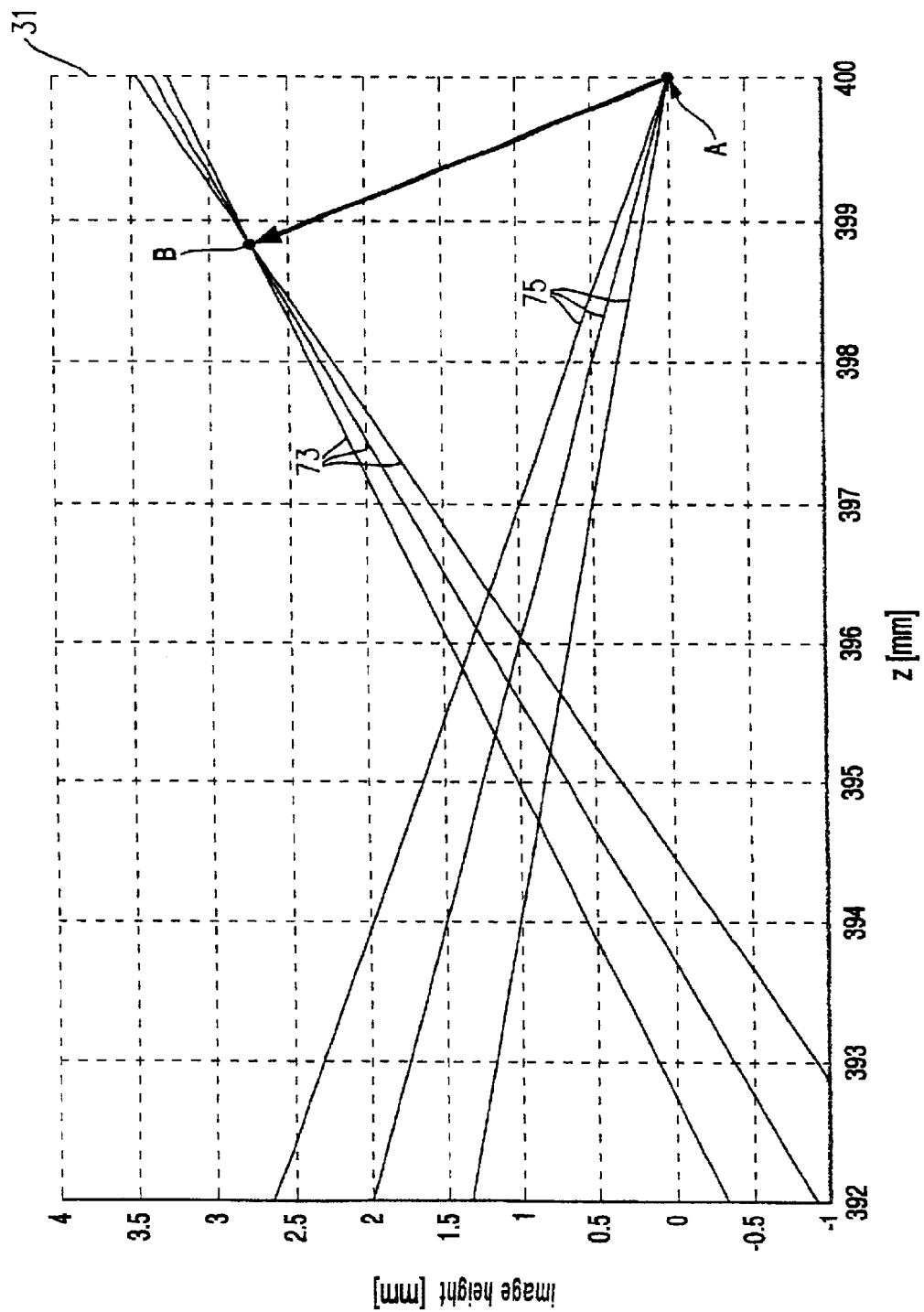
FIG. 6 is an enlarged representation of a part of FIG. 5 close to an image area of the lens arrangement.

In FIG. 5, the object plane 27 is disposed at the location z=0, the focusing lens 55 has a focal length of 61.5 mm and is disposed at the location z=160 mm. Accordingly, the intermediate plane 59 of the focusing lens 55 corresponding to the object plane at the location z=0 is positioned at the location z=260 mm. The focusing lens 57 has a focal length of 28.6 mm and is positioned at the location z=360 so that the intermediate plane 59 is imaged by the focusing lens 57 into the image plane 31 at the location z=400.

Be it assumed that the two focusing lenses 55 and 57 are aberration-free lenses so that the object plane 27 is actually imaged into the image plane 31. Accordingly, a subfield T in the object plane 27 is imaged, with the deflection lens device 63 being switched off, solely by the focusing lenses 55 and 57 into a subfield T' in the image plane 31. FIG. 5 shows a lower peripheral beam bundle 73 of the subfield T and an upper peripheral beam bundle 75 of the same.

Here, the deflection lens device 63 acts on the beams 73 and 75 such that they are each deflected in the intermediate image plane 59 by an angle α. As a result, the beam bundles 73, 75 do not entirely meet in the image plane 31. Merely beam bundle 75 which emerged in the object plane 27 from the optical axis, i.e., at an image height of 0 mm, combines on the image plane 31 (intersection point A in FIG. 6). The beam bundle 73, however, which emerged in the object plane 27 at an image height of 12 mm, combines about 1 mm in front of the image plane 31 at an intersection point B in FIG. 6.

This illustrates that the deflection lens device disposed in the intermediate image plane 59 acts to tilt the partial image in the image plane 31. The deflection lens device 63 disposed in the intermediate image plane 59 thus renders it possible to deliberately tilt the partial image in the image plane 31. Vice versa, it is thus also possible for an image produced by aberrations of the lens arrangement 29 and tilted out of the image plane 31 to be tilted such that it is returned into the image plane 31 and, as a result, the aberrations of the focusing lenses 55 and 57, respectively, are eventually compensated for, at least partially.

Figure 7A:
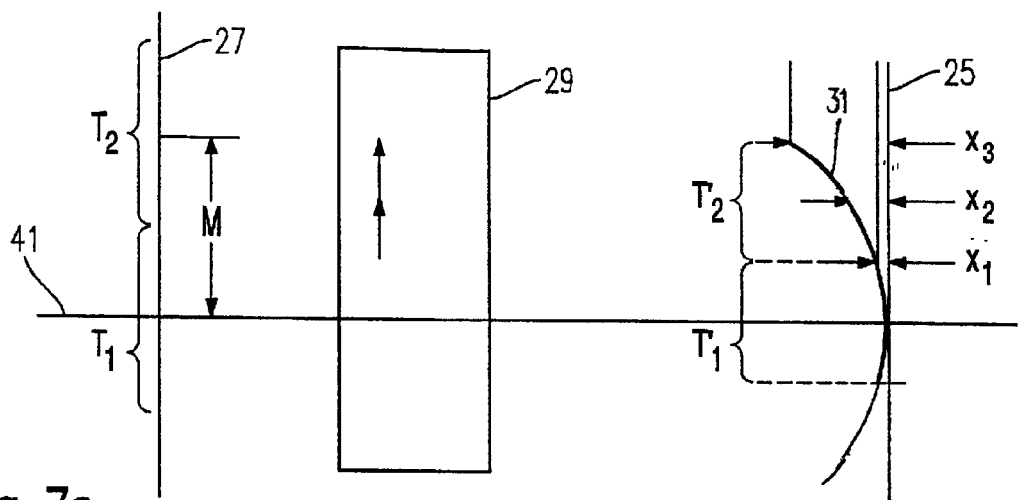
FIGS. 7A–7C show several representations for illustrating the aberration-reducing effect of the lens arrangement according to the invention.

This will be illustrated herein below with reference to FIG. 7. In this Figure, the lens arrangement 29 is merely schematically shown as imaging system in the form of a box which images an object area 27 provided as a plane into an image area 31. In FIG. 7a, the deflection lens device 63 is not in operation and effects of the image field curvature result into the image area to be not, as the object area 27, disposed in a plane 25, which is, for example, the surface of a wafer, but distinctly curved out of the same.

A subfield T1 disposed centrally in respect of the optical axis 41 is imaged by the lens arrangement 29 onto the curved image area 31 such that the center thereof is focused on the wafer 25, while its upper edge is focused spaced apart from the surface of the wafer 25 by a distance x1.

A subfield T2, the center of which is offset from the optical axis 41 by M, is imaged into a subfield T2', the center of which is focused at a distance x2 in front of the wafer 25 and the edges of which are focused at distances x1 and x3, respectively, in front of the wafer 25. It is apparent that the curvature of the image field 31 results into a considerable loss of definition in the plane of the wafer 25.

Figure 7B:
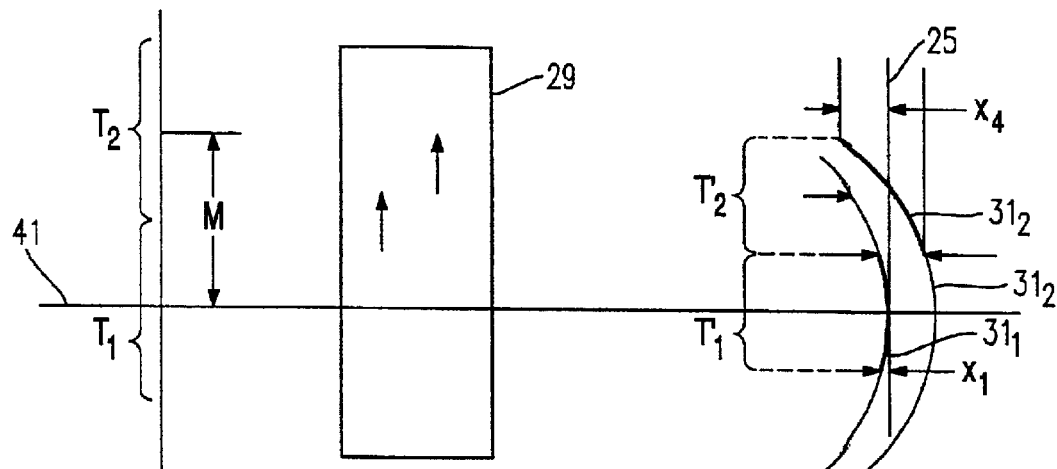

FIG. 7b shows a first measure to correct the image field curvature. In this Figure, the subfield T1 disposed centrally in respect of the optical axis 41 is imaged through the lens arrangement 29 in the direction of the wafer 25 in the same way as described with reference to FIG. 7a. Accordingly, the subfield T1 is imaged into a subfield T1' onto an image area $31_1$, the center of which is disposed on the wafer 25. Edges of the image field T1' thus have a malfocus of x1, as this was likewise the case in FIG. 7a.

In order for the subfield T2, which is offset from the optical axis 41 by the amount M, to be imaged, the dynamic focusing coil 65, however, provides a magnetic focusing field such that the object area 27 is imaged onto an image area $31_2$ which is shifted in respect of the image area $31_1$ for the subfield T1 such that a center of the imaged subfield T2' intersects the wafer 25 and is focused onto the same, respectively. As a result, substantially no malfocus occurs in the center of the imaged subfield T2', while the malfocus at the upper edge of the imaged subfield T2' is reduced to a value x4 which is smaller than the comparable malfocus x3 of FIG. 7a.

Figure 7C:
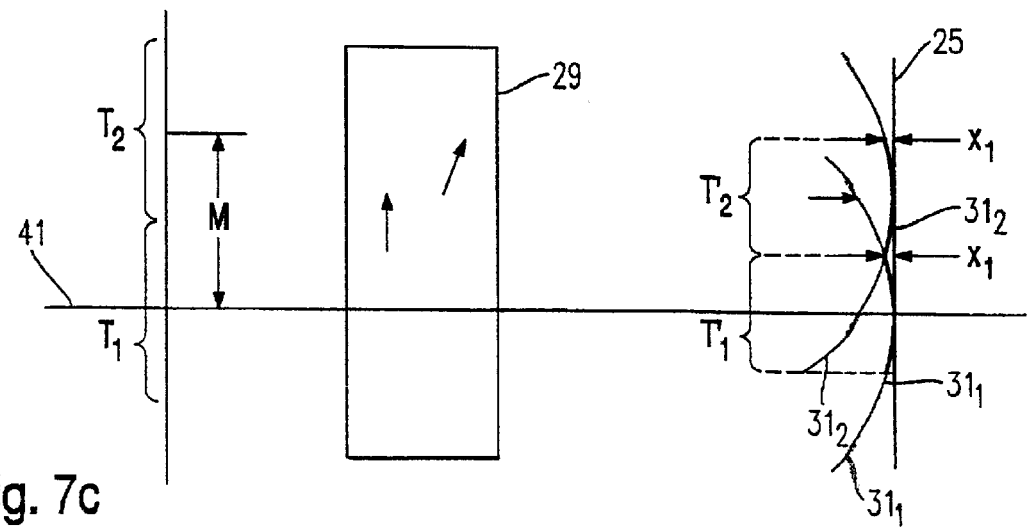

The aberration which has already been reduced in the imaging of the subfield T2 into the imaged subfield T2' by the operation of the dynamic focusing coil can further be reduced by the operation of the deflection lens device 63. This is illustrated in FIG. 7c. In FIG. 7c, too, the subfield T1 is imaged without the influence of the dynamic focusing coil 65 and the deflection lens device 63, as it was also the case in FIGS. 7a and 7b. However, the subfield T2 which is offset from the optical axis 41 by the amount M is imaged such that, as in FIG. 7b, the dynamic focusing coil 65 returns the focus of the center of the imaged subfield T2' onto the surface of the wafer 25. Moreover, by appropriately driving the deflection lens device 63, the image area is tilted into an image area $31_2$ such that the image area $32_2$ is oriented symmetrically in respect of the center of the imaged subfield T2' on the wafer 25. Accordingly, a malfocus at the edges of the imaged decentral subfield T2' is equal to the value x1 of the aberration at the edges of the imaged central subfield T1'.

As a result, subfields disposed spaced apart from the optical axis can also be imaged onto the wafer 25 at a quality which is comparable to that of the imaging close to the optical axis.

The selected tilt of the image area, in combination with a corresponding correction of focus, causes the image area for an imaged subfield to be approximated particularly well to a nominal image area, namely the wafer surface.

In a scanning system, wherein the illuminated subfield is moved uniformly across a planar object area, it is thus also possible to produce an image on a planar image area with relatively little aberrations caused by image field curvature, in that an image tilt caused by the deflection lens device is continuously increased with increasing deflection of the illuminated subfield. In particular, the deflection lens device is then driven such that the effect thereof changes proportional to the deflection of the subfield. Together with the change in the effect of the deflection lens device, the effect of the first or/and the second focusing lens device is also changed such that the focus thereof for the currently illuminated subfield coincides with the nominal image area. The change in the effect of the first or/and the second focusing lens device is performed with a substantially quadratic dependency on the deflection of the currently illuminated subfield.

In the above-described embodiment, the deflection lens device is formed by a magnetic dipole field. However, it is also possible to provide an electric dipole field or any other field which acts on a region around the intermediate image plane defined by the first focusing lens device 55 to deflect the beams and to tilt the intermediate image, respectively.

The first focusing lens device and the second focusing lens device, respectively, have been described in the above-described embodiment as a magnetic lens with pole shoes which is symmetric about the optical axis 41. Alternatively, it is also possible to produce the focusing effect by an electrostatic field.

For electric as well as magnetic focusing fields it is essential that they have a focusing effect in the region of the currently illuminated subfield, while it is not necessarily required for the fields to have a focusing effect in regions outside of the illuminated subfield.

The above-described embodiment of the lens arrangement according to the invention is employed in an electron projection lithographic system. However, it is also possible to use the lens arrangement in a system which does not employ electrons but, for example, ions. The lens arrangement is moreover suitable to be employed in a method for the manufacture of electronic devices as well as for the manufacture of other miniaturized devices, the imaging from the object area into the image area serving to expose a particle-sensitive layer in a lithographic step. However, the use of the lens arrangement is not limited to lithographic steps, but is possible whenever an object area is to be particle-optically imaged with high precision into an image area of a desired shape.

What is claimed is:

1. A lens arrangement for the particle-optical imaging of an object, to be imaged and positionable in an object area, into an image area, comprising:
    a first focusing lens device for providing a field having a focusing effect on the imaging particles for imaging the object from the object area into an intermediate image area,
    a second focusing lens device for providing a further field having a focusing effect on the imaging particles for imaging the object, which has been imaged into the intermediate image area, into the image area, and
    a deflection lens device for providing a field having a deflecting effect on the imaging particles in a region of the intermediate image area.

2. The lens arrangement according to claim 1, wherein the field of the first focusing lens device comprises at least one field selected from the group consisting of magnetic and electric field which is substantially axially symmetric in respect of a central beam of a bundle of beams.

3. The lens arrangement according to claim 1, wherein the field of the first focusing lens device comprises at least one field selected from the group consisting of two magnetic, electric dipole, and quadrupole field arrangements which are axially spaced apart from one another in respect of a central beam of a bundle of beams of the imaging particles.

4. The lens arrangement according to claim 1, wherein the field of the deflection lens device comprises a magnetic field which is substantially mirror-symmetric in respect of a plane jointly extending with a central beam of a bundle of beams of the imaging particles.

5. The lens arrangement according to claim 1, wherein the field of the deflection lens device comprises at least one field selected from the group consisting of magnetic and electric dipole field which is oriented transverse to a central beam of a bundle of beams of the imaging particles.

6. The lens arrangement according to claim 1, wherein an aperture stop is provided in at least one diffraction plane between the object area and the image area.

7. The lens arrangement according to claim 1, further comprising a first driving means for the deflection lens device for adjusting a strength of the deflecting field thereof, and a second driving means for adjusting a strength of the focusing fields in at least one of the first focusing lens device and the second focusing lens device, wherein the first driving means changes the field strength of the deflection lens device substantially proportionally dependent upon an external magnitude and the second driving means changes the field strength of the first focusing lens device and the second focusing lens device, respectively, substantially quadratically dependent upon the external magnitude.

8. The lens arrangement according to claim 7, wherein the lens arrangement is provided for imaging a subfield of the object area which is spaced apart from the optical axis of the lens arrangement by a variable distance onto the image area, and wherein the external magnitude comprises the distance of the subfield from the optical axis.

9. The lens arrangement according to claim 8, wherein the field of the deflection device deflects pairs of different beams of the particle beams imaging the subfield at substantially equal angles.

10. The lens arrangement according to claim 8, further comprising an illumination device for illuminating merely the subfield of the object area and a third driving means for the illumination device for driving the illumination device in order for the distance of the illuminated subfield from the optical axis to be changed.

11. The lens arrangement according to claim 8, wherein the image area and the object area each have a predetermined nominal shape, wherein the second driving means changes the strength of the deflecting field of the first and the second focusing device, respectively, such that a central region of the subfield is imaged substantially sharply onto the image area, and wherein the first driving means changes the strength of the deflecting field of the deflection lens device such that the peripheral regions of the subfield are also imaged substantially sharply onto the image area.

12. The lens arrangement of claim 11, wherein the shape of the object area is that of a plane.

13. Method for device manufacture, comprising: a photolithographic step, wherein the photolithographic step comprises the transfer of a pattern defined by a mask to a particle-sensitive substrate using a lens arrangement, the lens arrangement comprising:
    a first focusing lens device for providing a field having a focusing effect on the imaging particles for imaging the object from the object area into an intermediate image area,
    a second focusing lens device for providing a further field having a focusing effect on the imaging particles for imaging the object, which has been imaged into the intermediate image area, into the image area, and
    a deflection lens device for providing a field having a deflecting effect on the imaging particles in a region of the intermediate image area; and
    wherein the mask is disposed in the object area and the substrate is disposed in the image area.

14. The lens arrangement according to claim 1, wherein the field of the second focusing lens device comprises at least one field selected from the group consisting of magnetic and electric field which is substantially axially symmetric in respect of a central beam of a bundle of beams.

15. The lens arrangement according to claim 1, wherein the field of the first and the second focusing lens device comprises at least one field selected from the group consisting of magnetic and electric field which is substantially axially symmetric in respect of a central beam of a bundle of beams.

16. The lens arrangement according to claim 1, wherein the field of the second focusing lens device comprises at least one field selected from the group consisting of two magnetic, electric dipole, quadrupole field arrangements which are axially spaced apart from one another in respect of a central beam of a bundle of beams of the imaging particles.

17. The lens arrangement according to claim 1, wherein the field of the first and the second focusing lens device comprises at least one field selected from the group consisting of two magnetic, electric dipole, and quadrupole field arrangements which are axially spaced apart from one another in respect of a central beam of a bundle of beams of the imaging particles.

* * * * *